(12) United States Patent
Kim et al.

(10) Patent No.: US 8,836,213 B2
(45) Date of Patent: Sep. 16, 2014

(54) ORGANIC LIGHT EMITTING DIODE DISPLAY

(75) Inventors: Tae-Gon Kim, Yongin (KR); Sung-Soo Koh, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 217 days.

(21) Appl. No.: 13/049,740

(22) Filed: Mar. 16, 2011

(65) Prior Publication Data

US 2011/0241563 A1 Oct. 6, 2011

(30) Foreign Application Priority Data

Apr. 5, 2010 (KR) ........................ 10-2010-0030981

(51) Int. Cl.
| | |
|---|---|
| *H05B 33/12* | (2006.01) |
| *H01L 51/52* | (2006.01) |
| *H05B 33/08* | (2006.01) |
| *G09G 3/32* | (2006.01) |
| *H01L 27/32* | (2006.01) |

(52) U.S. Cl.
CPC .... *H05B 33/0896* (2013.01); *H01L 2251/5315* (2013.01); *G09G 2320/0223* (2013.01); *H01L 51/5228* (2013.01); *G09G 3/3225* (2013.01); *H01L 27/3276* (2013.01); *G09G 2330/02* (2013.01); *G09G 2300/0426* (2013.01); *H01L 51/5246* (2013.01)
USPC .......................................... 313/504; 313/509

(58) Field of Classification Search
CPC ..... H05B 33/26; H05B 33/28; H01L 51/5228
USPC ............ 313/498–512; 315/169.3; 345/36, 45, 345/76
See application file for complete search history.

(56) References Cited

U.S. PATENT DOCUMENTS

| | | | | |
|---|---|---|---|---|
| 6,175,345 | B1* | 1/2001 | Kuribayashi et al. ........... | 345/76 |
| 7,064,482 | B2* | 6/2006 | Park .............................. | 313/504 |
| 7,663,395 | B2* | 2/2010 | Chang et al. ............. | 324/760.01 |
| 2001/0011868 | A1* | 8/2001 | Fukunaga et al. ............ | 313/506 |
| 2003/0197466 | A1* | 10/2003 | Yamazaki et al. ............ | 313/504 |
| 2005/0077815 | A1* | 4/2005 | Miura ........................... | 313/503 |
| 2006/0113900 | A1* | 6/2006 | Oh ................................ | 313/504 |
| 2008/0018245 | A1* | 1/2008 | Kim et al. .................... | 313/512 |
| 2008/0191603 | A1* | 8/2008 | Kubota ........................ | 313/498 |
| 2009/0174318 | A1* | 7/2009 | Kim et al. .................... | 313/504 |
| 2010/0171419 | A1* | 7/2010 | Kim et al. .................... | 313/505 |

FOREIGN PATENT DOCUMENTS

| | | |
|---|---|---|
| JP | 2006-278241 A | 10/2006 |
| KR | 10-2005-0090807 A | 9/2005 |
| KR | 10-2006-0117481 A | 11/2006 |
| KR | 10-2007-0092017 A | 9/2007 |
| KR | 10-2008-0041437 A | 5/2008 |
| KR | 10-2009-0068499 A | 6/2009 |

* cited by examiner

*Primary Examiner* — Nimeshkumar Patel
*Assistant Examiner* — Christopher Raabe
(74) *Attorney, Agent, or Firm* — Knobbe, Martens, Olson & Bear LLP

(57) ABSTRACT

An OLED display is disclosed. The OLED display includes two substrates with organic light emitting elements therebetween. The organic light emitting elements include a second electrode in common among the organic light emitting elements, and one of the substrates includes an auxiliary electrode to connect to the common second electrode to reduce resistance in the electrical path from a power source to the second electrode.

18 Claims, 4 Drawing Sheets

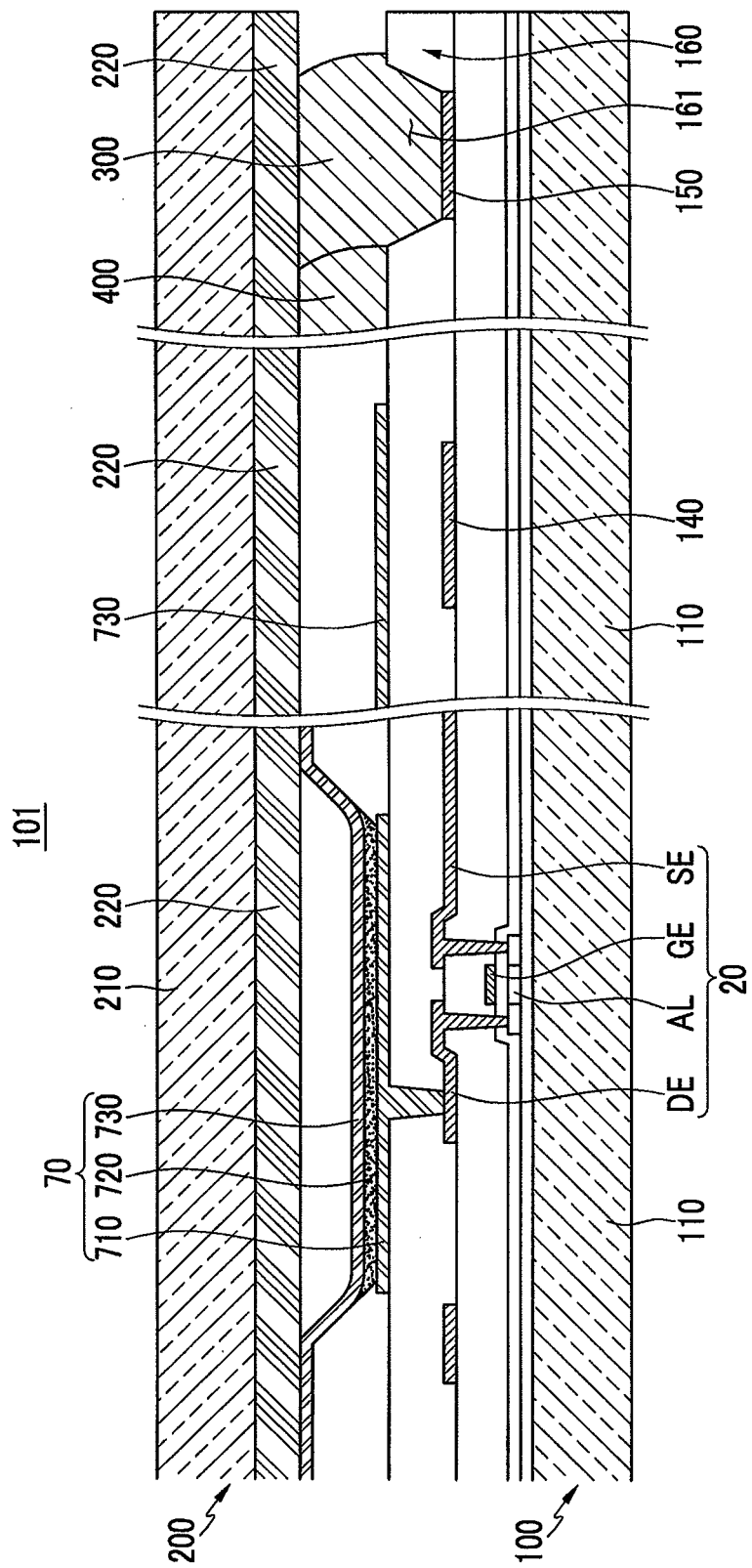

ORGANIC LIGHT EMITTING DIODE DISPLAY

CROSS-REFERENCE TO RELATED APPLICATIONS

This application claims priority to and the benefit of Korean Patent Application No. 10-2010-0030981 filed in the Korean Intellectual Property Office on Apr. 5, 2010, the entire contents of which are incorporated herein by reference.

BACKGROUND

1. Field

The described technology relates generally to an organic light emitting diode (OLED) display. More particularly, the described technology relates generally to an OLED display displaying an image by emitting light.

2. Description of the Related Technology

An organic light emitting diode (OLED) display has been recently used as a display device for displaying images.

The organic light emitting diode display is self-emissive, and differs from a liquid crystal display (LCD) in that it does not require a separate light source, and is relatively thin and light weight. Furthermore, the organic light emitting diode display exhibits high quality characteristics such as low power consumption, high luminance and short response time.

A conventional OLED display element includes a first electrode, an organic emission layer disposed on the first electrode, and a second electrode disposed on the organic emission layer.

Furthermore, an OLED display may be a front emission type, a rear emission type, or a dual emission type display. The front emission type OLED display has a structure in which the second electrode of the organic light emitting element is formed over the entire area of a substrate where the organic light emitting element is formed with thin film technology in order to minimize deterioration of its luminance.

However, since the second electrode is formed over the entire area of the substrate in the front emission type OLED display, a voltage drop occurs in driving power passing through the second electrode for driving the organic emission layer due to electrical resistance of the second electrode.

The above information disclosed in this Background section is only for enhancement of understanding of the background of the described technology and therefore it may contain information that does not form prior art to the instant embodiments that is already known in this country to a person of ordinary skill in the art.

SUMMARY OF CERTAIN INVENTIVE ASPECTS

One inventive aspect is an organic light emitting diode (OLED) display including a first substrate, and an organic light emitting element including a first electrode disposed on the first substrate, an organic emission layer disposed on the first electrode, and a second electrode disposed on the organic emission layer. The OLED display also includes a driving power line disposed between the organic light emitting element and an edge of the first substrate on the first substrate, and having a driving power voltage for the second electrode. The OLED display also includes a second substrate facing the first substrate, where the organic light emitting element is between the first and second substrates, an auxiliary electrode disposed between the organic light emitting element and the second substrate, and contacting the second electrode, and a connection unit disposed between the driving power line and the auxiliary electrode, and connecting the driving power line and the auxiliary electrode.

BRIEF DESCRIPTION OF THE DRAWINGS

FIG. 4 is a cross-sectional view of FIG. 3, taken along the line IV-IV.

DETAILED DESCRIPTION OF CERTAIN INVENTIVE EMBODIMENTS

Figure 1:
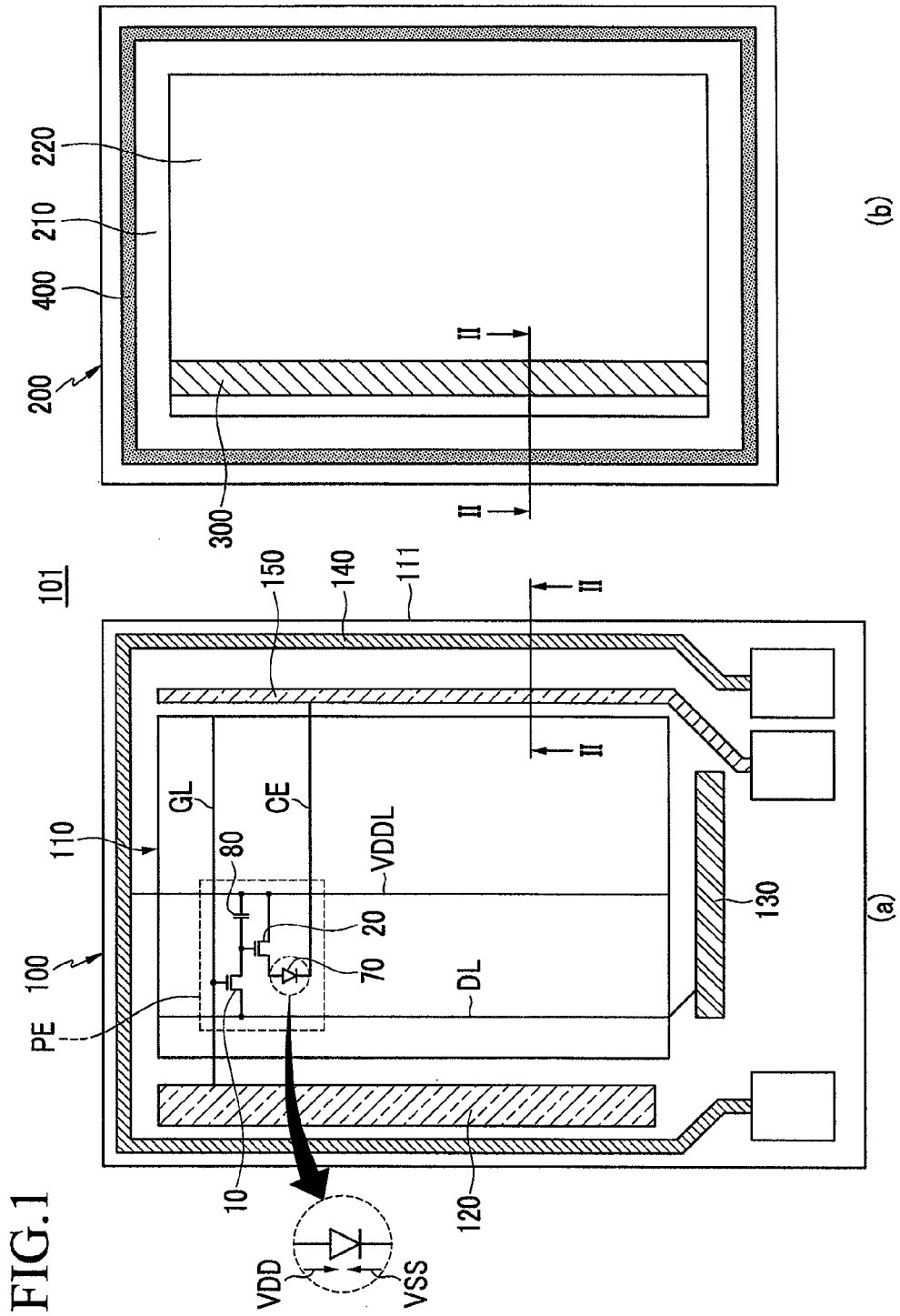
FIG. 1 is a top plan view of an organic light emitting diode (OLED) according to a first exemplary embodiment.

Certain embodiments are described more fully hereinafter with reference to the accompanying drawings, in which exemplary embodiments are shown. As those skilled in the art would realize, the described embodiments may be modified in various ways, without departing from the spirit or scope of the present invention.

The drawings and description are to be regarded as illustrative in nature and not restrictive. Like reference numerals generally designate like elements throughout the specification.

Furthermore, in the discussion of the exemplary embodiments, detailed description is made as to the constituent elements of the first exemplary embodiment with reference to the relevant drawings by generally using the same reference numerals for corresponding constituent elements, while constituent elements different from those related to the first exemplary embodiment are described in other exemplary embodiments.

Furthermore, as the size and thickness of the respective structural components shown in the drawings are arbitrarily illustrated for explanatory convenience, the present invention is not necessarily limited to the illustrated embodiments.

In the drawings, in some cases, the thickness of layers, films, panels, regions, etc., are exaggerated for clarity.

It will be understood that when an element such as a layer, film, region, or substrate is referred to as being "on" another element, it can be directly on the other element or intervening elements may be present.

In addition, unless explicitly described to the contrary, the word "comprise" and variations such as "comprises" or "comprising" will be understood to imply the inclusion of stated elements but not the exclusion of any other elements. Further, in the specification, an upper or lower part of a certain element indicates an upper part or a lower part of the element, and does not suggest that the element is always positioned at the upper side based on a gravity direction.

Hereinafter, an organic light emitting diode (OLED) display 101 according to a first exemplary embodiment will be described with reference to FIG. 1 and FIG. 2.

FIG. 1 is a top plan view of the OLED display according to the some embodiments. In FIG. 1, (a) is a top plan view of a element substrate 100 of the OLED display 101 and (b) is a top plan view of an encapsulation substrate 200 of the OLED display 101.

As shown in FIG. 1, the OLED display 101 includes an element substrate 100, an encapsulation substrate 200, a connection unit 300, and a sealant 400.

The element substrate 100 includes a first substrate 110, an organic light emitting element 70, a gate driver 120, a data driver 130, a common power bus line 140, and a driving power line 150.

The first substrate 110 may, for example, be made of an insulating substrate such as glass or plastic, and a plurality of pixels PE are formed on the first substrate 110.

Each pixel PE includes the organic light emitting element 70, and emits light from the organic light emitting element 70.

A structure of the pixel PE will now be described in further detail.

In the OLED display 101 according to the first exemplary embodiment, each pixel PE has a 2Tr-1Cap structure with an organic light emitting diode 70, two thin film transistors (TFTs) 10 and 20, and a capacitor 80. However, the first exemplary embodiment is not limited thereto. The OLED display 101 may be variously structured such that three or more thin film transistors and/or two or more capacitors are provided at one pixel PE. The additional thin film transistor and capacitors may, for example, form a compensation circuit.

The compensation circuit improves the uniformity of the organic light emitting diodes 70 formed in the pixels PE, and improves image quality. The compensation circuit includes, for example, two to eight thin film transistors.

The organic light emitting diode 70 includes an anode being a hole injection electrode, a cathode being an electron injection electrode, and an organic emissive layer disposed between the anode and the cathode.

One pixel PE includes a first thin film transistor 10 and a second thin film transistor 20.

The first and second thin film transistors 10 and 20 each pixel PE include a gate electrode, a semiconductor layer, a source electrode, and a drain electrode.

FIG. 1 illustrates a structure with a gate line GL, a data line DL, a common power line VDDL, and a cathode electrode CE in the pixel PE, but the pixel PE included in the OLED display 101 of the first exemplary embodiment is not limited to the structure shown in FIG. 1.

A source electrode of the first thin film transistor 10 is connected to the data line DL from the data driver 130, and a gate electrode of the first thin film transistor 10 is connected to the gate line GL from the gate driver 120. In addition, a node is formed between the drain electrode of the first thin film transistor 10, the capacitor 80 and the gate electrode of the second thin film transistor 20. In addition, the common power line VDDL from the common power bus line 140 is connected to a source electrode of the second thin film transistor 20, and an anode of the organic light emitting element 70 is connected to a drain electrode of the second thin film transistor 20. In addition, a cathode CE of the organic light emitting element 70 is connected to the driving power line 150.

The first thin film transistor 10 is used as a switch for selecting a pixel PE for light emission. When the first thin film transistor 10 turns on, the capacitor 80 is charged. At this time, the amount of charge is proportional to the potential of the voltage applied from the data line DL. When the gate potential of the second thin film transistor 20 goes over its threshold voltage, the second thin film transistor 20 is turned on. Then, first power voltage VDD which is applied to the common power line VDDL from the common power bus line 140 is applied to the anode of the organic light emitting element 70 through the second thin film transistor 20. Second power voltage VSS is applied to the cathode CE of the organic light emitting element 70 from the driving power line 150, and the organic light emitting element 70 emits light.

The structure of the pixel PE is not limited to that described, but may be variously modified.

Each of the gate driver 120, the data driver 130, the common power bus line 140, and the driving power line 150 are disposed between the organic light emitting element 70 and an edge 111 of the substrate 110, and the driving power line 150 is connected with the cathode CE of the organic light emitting element 70. This will be described in further detail with reference to FIG. 2.

Figure 2:
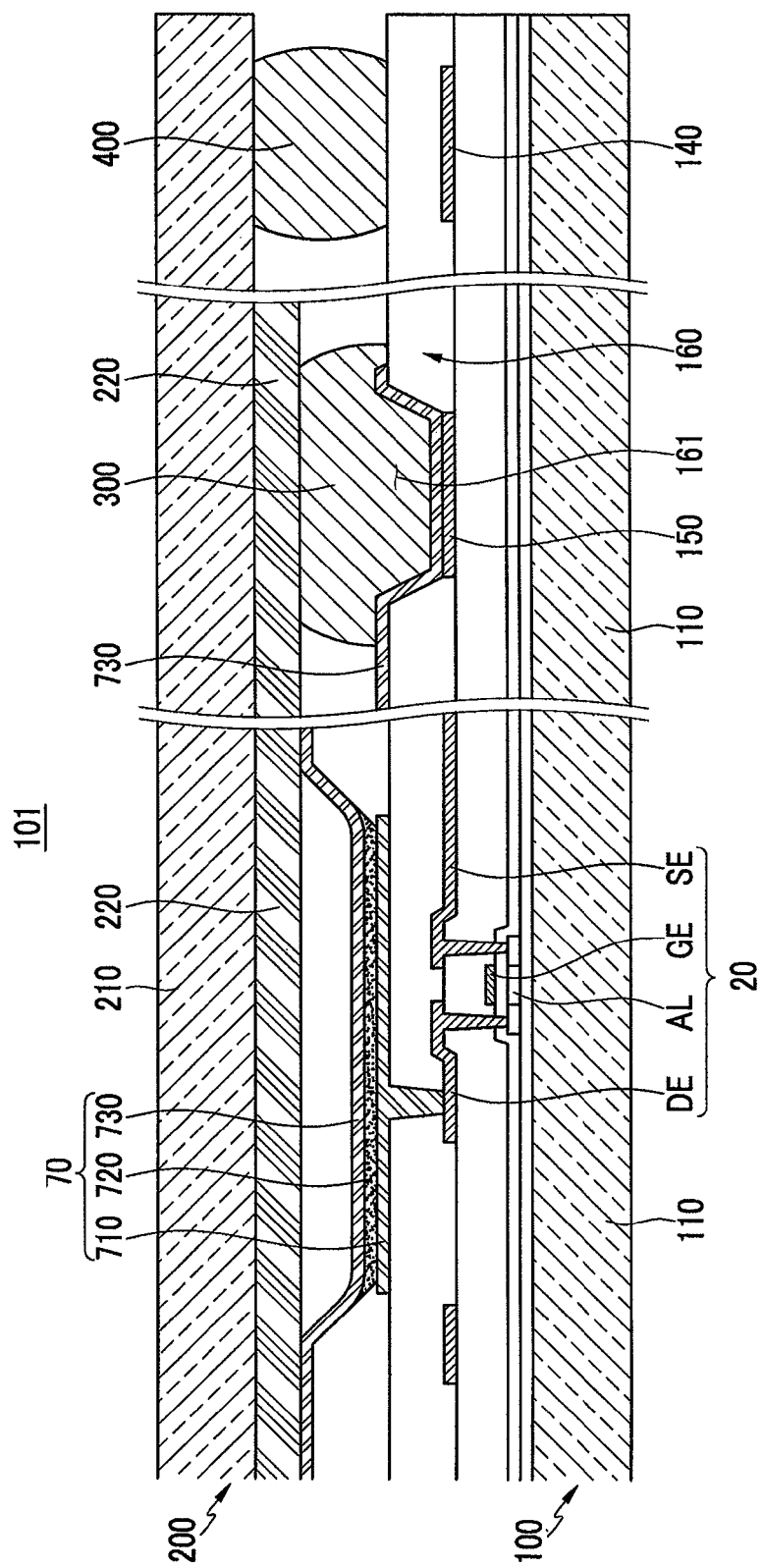
FIG. 2 is a cross-sectional view of FIG. 1, taken along the line II-II.

FIG. 2 has a cross-sectional view of FIG. 1, taken along the line II-II. FIG. 2 also illustrates a cross-sectional view of the second thin film transistor 20 and the organic light emitting element 70 in the pixel PE of the OLED display according to the first exemplary embodiment. In addition, FIG. 2 shows a cross-sectional view of the element substrate 100 of (a) in FIG. 1 and the encapsulation substrate 200 of (b) in FIG. 1 in the sealed state.

As shown in FIG. 2, the second thin film transistor 20 of the OLED display 101 includes a semiconductor layer AL, a gate electrode GE, a source electrode SE, and a drain electrode DE.

The second thin film transistor 20 receives the first power voltage VDD from the common power line VDDL and applies the voltage VDD to a first electrode 710 of the organic light emitting element 70 through the source electrode SE, the semiconductor layer AL, and the drain electrode DE. The first electrode 710 of the organic light emitting element 70 extends from the drain electrode DE, and the drain electrode DE and the first electrode 710 are electrically connected.

The organic light emitting element 70 includes a first electrode 710, an organic emission layer 720 formed on the first electrode 710, and a second electrode 730 formed on the organic emission layer 720.

The first electrode 710 is an anode which is a hole injection electrode, and the second electrode 730 is a cathode which is an electron injection electrode. However, embodiments are not limited thereto. That is, the first electrode 710 may function as the cathode, while the second electrode 730 functions as the anode according to a driving method of the OLED display 101. If the first power voltage VDD is supplied from the common power bus line 140 to the first electrode 710 through the second thin film transistor 20 and the second power voltage VSS is supplied to the second electrode 730, holes and electrons from the first and second electrodes 710 and 730 are injected into the organic emission layer 720, and emission of light from the organic emission layer 720 occurs when excitons are generated as a result of the recombination of the injected holes and electrodes as they drop from the excited state to the ground state. In addition, the first electrode 710 includes a single-layered or multi-layered light reflective conductive material such as aluminum (Al) and silver (Ag), and the second electrode 730 includes a single-layered or multi-layered light transmissive conductive material such as indium tin oxide (ITO) and indium zinc oxide (IZO). As described, the organic light emitting element 70 of the OLED display 101 emits light through the second electrode 730. That is, the OLED display 101 is a front-emission type display.

An OLED display according to another exemplary embodiment may be realized as a rear-emission type display with a first electrode made of a light transmissive conductive material and a second electrode made of a light reflective conductive material, or may be realized as a dual-emission type display with first and second electrodes made of a light transmissive conductive material.

The second electrode 730 is formed as a thin film to improve transmittance of light emitted from the organic emission layer 720, and is formed as one film over the entire area of the plurality of pixels PE.

The second electrode 730 extends from the pixel PE including the organic emission layer 720 to the driving power line 150, and is directly connected with the driving power line 150 through an opening 161 of an insulation layer 160, exposing the driving power line 150.

Referring again to FIG. 1 and FIG. 2, the encapsulation substrate 200 includes a second substrate 210 and an auxiliary electrode 220.

The second substrate 210 is formed with an insulating substrate made of glass or plastic, and faces the first substrate 110, with the organic light emitting element 70 between the first and second substrates 110 and 120. The auxiliary electrode 220 is disposed on the second substrate 210.

The auxiliary electrode 220 is disposed between the organic light emitting element 70 and the second substrate 210, and contacts the second electrode 730 of the organic light emitting element 70. The auxiliary electrode 220 may be formed with a single-layered or multi-layered light transmissive conductive layer including a material such as indium tin oxide (ITO), indium zinc oxide (IZO), molybdenum (Mo), aluminum (Al), and silver (Ag), and light emitted from the organic light emitting element 70 is transmitted through the auxiliary electrode 220 and through the second substrate 210. The auxiliary electrode 220 extends from the pixel PE to the driving power line 150. The connection unit 300 electrically connects the auxiliary electrode 220 and the driving power line 150.

The connection unit 300 is in a location corresponding to the driving power line 150, and is disposed between the driving power line 150 and the auxiliary electrode 220. The connection unit 300 connects the driving power line 150 and the auxiliary electrode 220. The connection unit 300 includes a conductive material such as a low resistance metal such as copper (Cu), gold (Au), silver (Ag), aluminum (Al), lead (Pb), nickel (Ni), and platinum (Pt), or a carbon nano tube (CNT). The conductive material comprised the connection unit 300 is not limited as long as general conductive material. The connection unit 300 may be formed by applying through nozzle of printing a conductive paste or a liquefied getter type material which comprises at least one of the conductive material and can be dried at room temperature. As described, the, connection unit 300 includes the conductive material and connects the driving power line 150 and the auxiliary electrode 220 so that the second power voltage VSS is applied to the auxiliary electrode 220 through the connection unit 300, and the second power voltage VSS is supplied to the second electrode 730 through the auxiliary electrode 220 contacting the second electrode 730.

That is, the second power voltage VSS is supplied not only to the second electrode 730 directly connected with the driving power line 150 but also by the auxiliary electrode 220 connected with the driving power line 150 through the connection unit 300. As a result, the second power voltage VSS from the driving power line 150 is uniformly supplied to the entire second electrode 730.

In addition, the connection unit 300 includes one or more of alumino-silicate hydroxyapatite, alumina, silica, alkali metal salts, and alkali earth metal oxides, and extends the lifespan of the organic light emitting element 70 by blocking moisture from the organic light emitting element 70.

In the OLED display 101, as shown in FIG. 1, the connection unit 300 is formed in a bar shape in a location corresponding to the driving power line 150, but it may be formed in other shapes. For example, the driving power line 150 may be a closed loop, which for example, surrounds a pixel including an organic light emitting element in an OLED display according to another exemplary embodiment.

A sealant 400 that seals the first and second substrates 110 and 210 may, for example, be disposed between the driving power line 150 where the connection unit 300 is located and an edge of the first substrate 110, as shown in FIGS. 1 and 2.

The sealant 400 is disposed between the driving power line 150 and the edge 111 of the first substrate 110 between the first and second substrates 110 and 210, and seals the element substrate 100 and the encapsulation substrate 200 to form an air tight bond.

As described, the OLED display 101 has a structure in which the auxiliary electrode 220 is directly connected with the driving power line 150 by the connection unit 300 and contacts the second electrode 730 so that the second power voltage VSS, which is the driving power supplied to the second electrode 730 from the driving power line 150, is uniformly supplied to the entire area of the second electrode 730, and accordingly a voltage drop that may otherwise occur in the second power voltage VSS due to electrical resistance of the second electrode 730 can be minimized.

Particularly, the second power voltage VSS is supplied from the driving power line 150 to the second electrode 730 through the auxiliary electrode 220 and the connection unit 300 so that current does not concentrate in a part of the second electrode 730 that is directly connected with the driving power line 150. Accordingly, damage to the part of the second electrode 730 due to the high density of current can be minimized.

In addition, in some embodiments, the connection unit 300 includes a moisture absorbing material so that the connection unit 300 prevents moisture from reaching the organic light emitting element 70 from the outside. As described, the connection unit 300 may function as a getter by including the moisture absorbing material so that the lifespan of the organic light emitting element 70 is extended, and accordingly, the life-span of the OLED display 101 is extended.

In addition, in the OLED display 101 the auxiliary electrode 220 and the driving power line 150 are connected with one another not through a thin film but through the connection unit 300 so that a thick film is formed therebetween. The thick film has better sheet resistance than a thin film, and accordingly occurrence of defects due to electrical resistance between the auxiliary electrode 220 and the connection unit 300 and between the connection unit 300 and the driving power line 150 are reduced.

Hereinafter, an OLED display 102 according to a second exemplary embodiment will be described with reference to FIG. 3 and FIG. 4.

Figure 3:
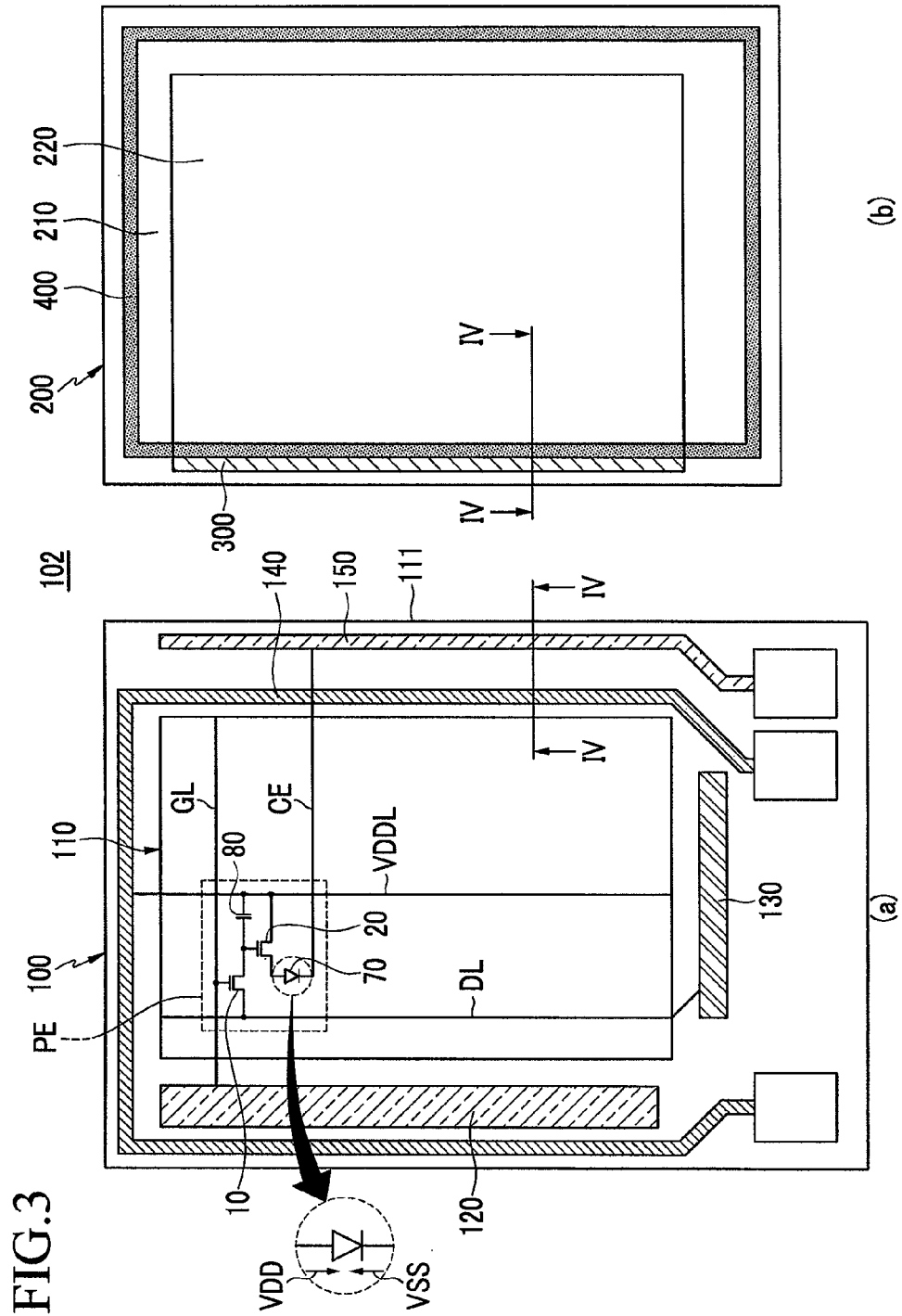
FIG. 3 is a top plan view of an OLED display according to a second exemplary embodiment.

FIG. 3 is a top plan view of an OLED display according to some exemplary embodiments. FIG. 4 is a cross-sectional view of FIG. 3, taken along the line IV-IV.

As shown in FIG. 3 and FIG. 4, in the OLED display 102 a second electrode 730 extends from a pixel PE including an organic emission layer 720 to a common power bus line 140.

A driving power line 150 is disposed between a sealant 400 and an edge 111 of a first substrate 110. A connection unit 300 connects the driving power line 150 and an auxiliary electrode 220. The connection unit 300 connects the driving power line 150 and the auxiliary electrode 220 so that second power voltage VSS from the driving power line 150 is applied to the auxiliary electrode 220 through the connection unit 300.

Accordingly, the second power voltage VSS is supplied to the auxiliary electrode 220 connected with the driving power line 150 by the connection unit 300 and is uniformly supplied to the entire area of the second electrode 730 through the auxiliary electrode 220.

The sealant 400 is disposed between the driving power line 150 and an organic light emitting element 70 between first and second substrates 110 and 210, and seals an element substrate 100 and an encapsulation substrate 200 to form an air-tight seal.

The connection unit 300 is disposed between the sealant 400 and an edge 111 of the first substrate 110, and contacts the sealant 400. The connection unit 300 may be formed with a paste and may coat the sealant 400.

In the OLED display 102, the connection unit 300 may be in a bar shape in a location corresponding to the driving power line 150. The connection unit 300 of an OLED display may alternatively be formed in a closed loop surrounding the sealant 400.

In this embodiment, the auxiliary electrode 220 is connected with the driving power line 150 by the connection unit 300 and the auxiliary electrode 220 contacts the driving power line 150 so that the second power voltage VSS is uniformly supplied to the entire area of the second electrode 220, and accordingly, a voltage drop that may otherwise occur in the second power voltage VSS due to electrical resistance of the second electrode 730 can be minimized.

Because the second power voltage VSS is supplied to the second electrode 730 through the auxiliary electrode 220 via the connection unit 300, the driving power line 150 and the second electrode 730 are indirectly connected. Accordingly, a problem that may occur when the driving power line 150 and the second electrode 730 are directly connected can be prevented. Accordingly, if desired, a process for directly connecting the driving power line 150 and the second electrode 730 can be omitted.

In addition, in the OLED display 102, the connection unit 300 is disposed between the sealant 400 and the edge 111 of the first substrate 110. Penetration of moisture from the outside to the organic light emitting element 70 is blocked by the sealant 400, and accordingly the life-span of the OLED display 102 is extended.

Furthermore, in the OLED display 102 of the second exemplary embodiment, the connection unit 300 contacts and is adjacent to the sealant 400 so that damage to the sealant 400 due to mechanical impact applied to the OLED display 102 can be prevented and accordingly impact resistance of the OLED display 102 is enhanced.

While various aspects have been described in connection with what is presently considered to be practical exemplary embodiments, it is to be understood that the invention is not limited to the disclosed embodiments, but, on the contrary, is intended to cover various modifications and equivalent arrangements.

What is claimed is:

1. An organic light emitting diode (OLED) display comprising:
    a first substrate;
    an organic light emitting element comprising:
        a first electrode disposed on the first substrate,
        an organic emission layer disposed on the first electrode, and
        a second electrode disposed on the organic emission layer;
    a driving power line disposed between the organic light emitting element and an edge of the first substrate on the first substrate, and having a driving power voltage for the second electrode;
    a second substrate facing the first substrate, wherein the organic light emitting element is between the first and second substrates;
    an auxiliary electrode disposed between the organic light emitting element and the second substrate, wherein the auxiliary electrode contacts the second substrate over a light emitting portion and the second electrode, and wherein the auxiliary electrode extends over the organic emission layer, wherein the auxiliary electrode is not in direct contact with the second electrode in the portion where the second electrode is disposed directly on the organic emission layer; and
    a connection unit disposed between the driving power line and the auxiliary electrode, and connecting the driving power line and the auxiliary electrode,
    wherein the second electrode is disposed between the connection unit and the driving power line, and is directly connected with the driving power line.

2. The OLED display of claim 1, wherein the connection unit comprises a moisture absorbing material.

3. The OLED display of claim 2, further comprising a sealant disposed between the driving power line and the edge of the first substrate between the first and second substrates and sealing the first and second substrates.

4. The OLED display of claim 3, wherein the second electrode is directly connected with the driving power line.

5. The OLED display of claim 4, wherein the first electrode comprises a light reflective conductive material and the second electrode comprises a light transmissive conductive material.

6. The OLED display of claim 2, further comprising a sealant disposed between the driving power line and the organic light emitting element between the first and second substrates and sealing the first and second substrates.

7. The OLED display of claim 6, wherein the connection unit is disposed between the sealant and the outer edge of the first substrate.

8. The OLED display of claim 7, wherein the connection unit contacts the sealant.

9. The OLED display of claim 1, wherein the connection unit comprises a conductive material.

10. The OLED display of claim 6, wherein the connection unit comprises a moisture absorbing material.

11. The OLED display of claim 1, wherein the connection unit directly connects the driving power line and the auxiliary electrode.

12. The OLED display of claim 1, wherein the driving power line directly connects to the second electrode.

13. The OLED display of claim 1, wherein the auxiliary electrode comprises a light transmissive conductive material.

14. The OLED display of claim 1, wherein the connection unit is formed in a closed loop surrounding the sealant.

15. The OLED display of claim 1, wherein the auxiliary electrode is substantially flat.

16. The OLED display of claim 1, wherein the auxiliary electrode contacts the second substrate over the organic emission layer.

17. The OLED display of claim 1, wherein the auxiliary electrode contacts the second substrate over a non-light emitting portion.

18. The OLED display of claim 1 wherein the auxiliary electrode and the connection unit are made from different materials.

* * * * *